(12) United States Patent
Colburn et al.

(10) Patent No.: US 8,361,704 B2
(45) Date of Patent: Jan. 29, 2013

(54) METHOD FOR REDUCING TIP-TO-TIP SPACING BETWEEN LINES

(75) Inventors: Matthew E. Colburn, Schenectady, NY (US); Wai-kin Li, Beacon, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 754 days.

(21) Appl. No.: 12/352,051

(22) Filed: Jan. 12, 2009

(65) Prior Publication Data

US 2010/0178615 A1 Jul. 15, 2010

(51) Int. Cl.
G03F 7/20 (2006.01)

(52) U.S. Cl. .................................................. 430/323

(58) Field of Classification Search ............... 430/311, 430/313, 323, 330
See application file for complete search history.

(56) References Cited

U.S. PATENT DOCUMENTS

| | | | |
|---|---|---|---|
| 2005/0173750 A1* | 8/2005 | Park ................................ | 257/304 |
| 2005/0208752 A1 | 9/2005 | Colburn et al. | |
| 2008/0085601 A1* | 4/2008 | Park et al. ...................... | 438/637 |
| 2008/0099845 A1 | 5/2008 | Yang et al. | |
| 2008/0164558 A1 | 7/2008 | Yang et al. | |
| 2008/0311347 A1 | 12/2008 | Millward et al. | |
| 2008/0318005 A1* | 12/2008 | Millward ........................ | 428/172 |
| 2009/0253238 A1* | 10/2009 | Shi et al. ........................ | 438/279 |
| 2009/0263628 A1* | 10/2009 | Millward ........................ | 428/173 |

FOREIGN PATENT DOCUMENTS

| | | |
|---|---|---|
| WO | WO2006112887 A2 | 10/2006 |
| WO | WO2008097736 A2 | 8/2008 |
| WO | WO2009094282 A1 | 7/2009 |
| WO | WO2009102551 A2 | 8/2009 |

OTHER PUBLICATIONS

Cheng, et al., "Self-Assembled One-Dimensional Nanostructure Arrays", Nano Lett., vol. 6, No. 9, pp. 2099-2103, 2006.
U.S. Appl. No. 11/424,963, "Sub-Lithographic Feature Patterning Using Self-Aligned Self-Assembly Polymers", filed Jun. 19, 2006, Yang, et al.
U.S. Appl. No. 11/950,600, "A Patterning Method Using A Combination of Photolithography and Copolymer Self-Assembling Lithography Technique", filed Dec. 5, 2007, Li, et al.
Cheng, JY, et al.: "Templated Self-Assembly of Block Copolymers: Effect of Substrate Toporaphy"—Advanced Materials, vol. 15 No. 19, Oct. 2, 2003 pp. 1599-1602—XP007905612.

(Continued)

Primary Examiner — Brittany Raymond
(74) Attorney, Agent, or Firm — Wenjie Li; Catherine Ivers

(57) ABSTRACT

This invention provides a method for reducing tip-to-tip spacing between lines using a combination of photolithographic and copolymer self-assembling lithographic techniques. A mask layer is first formed over a substrate with a line structure. A trench opening of a width d is created in the mask layer. A layer of a self-assembling block copolymer is then applied over the mask layer. The block copolymer layer is annealed to form a single unit polymer block of a width or a diameter w which is smaller than d inside the trench opening. The single unit polymer block is selectively removed to form a single opening of a width or a diameter w inside the trench opening. An etch transfer process is performed using the single opening as a mask to form an opening in the line structure in the substrate.

26 Claims, 22 Drawing Sheets

OTHER PUBLICATIONS

Sang-Min Park, et al.: "Directed Assembly of Lamellae-Forming Block Copolymers by Using Chemically and Topographically Patterned Substrates."—Advanced Materials, vol. 19 No. 4, Jan. 26, 2007, pp. 607-611—XP007905662.

International Search Report and The Written Opinion PCT/EP2009/065847 Filed: Nov. 25, 2009 Applicant: International Business Machines.

* cited by examiner

METHOD FOR REDUCING TIP-TO-TIP SPACING BETWEEN LINES

FIELD OF THE INVENTION

This invention relates to a photolithography process for semiconductor fabrication. More particularly, this invention is directed to a method for reducing tip-to-tip spacing between lines using a combination of photolithographic and copolymer self-assembling lithographic techniques.

BACKGROUND OF THE INVENTION

Photolithography is commonly used to make miniaturized electronic components such as integrated circuits in semiconductor manufacturing. In a photolithography process, a layer of photoresist is deposited on a substrate, such as a silicon wafer. The substrate is baked to remove any solvent remained in the photoresist layer. The photoresist is then selectively exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution to remove either the exposed portions of the photoresist for a positive photoresist or the unexposed portions of the photoresist for a negative photoresist. The patterned photoresist can then be used as a mask for subsequent fabrication processes on the substrate, such as deposition, etching, or ion implantation processes.

Advances in semiconductor device performance have typically been accomplished through a decrease in semiconductor device dimensions. It is known that the tip-to-tip spacing between lines (e.g., PC lines) has a high impact on the unit cell density of the semiconductor device. Reducing the tip-to-tip distance between lines will greatly increase the unit cell density which in turn will lead to a shrinkage in the device dimension. However, due to the line end shortening issue and the resolution limitation of photolithography, the currently available lithographic techniques can only achieve a tip-to-tip distance of not less than 100 nm.

It has been known that certain materials are capable of organizing into ordered structures without the need for human interference, which is referred to as the self-assembly of materials. Self-assembling copolymer lithographic techniques have been developed to form useful periodic patterns with dimensions in the range of 10 to 40 nm. Each self-assembling block copolymer system contains two or more different polymeric block components which are immiscible with one another. Under suitable conditions, these polymeric block components can separate into two or more different phases on a nanometer-scale and thereby form ordered nano-sized patterns. Such ordered patterns can be used for fabricating nano-scale structural units in semiconductor, optical and magnetic devices.

However, the complementary metal oxide semiconductor (CMOS) technology requires precise placement or registration of individual structural units to form metal lines and vias in the wiring level. The large, ordered array of repeating structural units formed by self-assembling block copolymers cannot be used in the CMOS technology, because of the lack of alignment or registration of the positions of individual structural units.

SUMMARY OF THE INVENTION

The present invention provides a method for reducing tip-to-tip spacing between lines using a combination of photolithographic and copolymer self-assembling lithographic techniques.

In one aspect, the present invention relates to a method for reducing tip-to-tip spacing between lines involving the steps of providing a substrate and a line structure in the substrate; forming a mask layer over the substrate; performing a lithographic process over the mask layer to create a trench opening of a width d in the mask layer, wherein the trench opening is above the line structure in the substrate and perpendicular to the line structure; applying a layer of a block copolymer over the mask layer, wherein the block copolymer comprises at least first and second polymeric block components A and B respectively that are immiscible with each other; annealing the block copolymer layer to form a single unit polymer block of a width or a diameter w inside the trench opening, wherein w<d, and wherein the single unit polymer block comprises the polymeric block component B and is embedded in a polymeric matrix that comprises the first polymeric block component A; selectively removing the second polymeric block component B to form a single opening of a width or a diameter w in the polymeric matrix inside the trench opening; and performing an etch transfer process using the single opening as a mask to form an opening in the line structure in the substrate.

In another aspect, the present invention relates to a method for reducing tip-to-tip spacing between lines involving the steps of providing a substrate and a line structure in the substrate; forming a first mask layer over the substrate; forming a second mask layer over the first mask layer; performing a lithographic process over the second mask layer to create a trench opening of a width d in the second mask layer, wherein the trench opening is above the line structure in the substrate and perpendicular to the line structure; applying a layer of a block copolymer over the second mask layer, wherein the block copolymer comprises at least first and second polymeric block components A and B respectively that are immiscible with each other; annealing the block copolymer layer to form a single unit polymer block of a width or a diameter w inside the trench opening, wherein w<d, and wherein the single unit polymer block comprises the polymeric block component B and is embedded in a polymeric matrix that comprises the first polymeric block component A; selectively removing the second polymeric block component B to form a single opening of a width or a diameter w in the polymeric matrix inside the trench opening; performing a first etch transfer process using the single opening as a mask to form an opening in the first mask layer; and performing a second etch transfer process using the opening in the first mask layer as a mask to form an opening in the line structure in the substrate.

The present invention may further involves the steps of forming an underlayer over the substrate before forming the mask layer or layers; and stripping any remaining block copolymer layer, mask layer or layers, and underlayer, after performing the etch transfer process or processes.

The block copolymer of the present invention, when placed and annealed on a planar surface, self-assemblies into an ordered array of multiple unit polymer blocks embedded in the polymeric matrix, wherein each of the multiple unit polymer blocks has the width or diameter w, and the multiple unit polymer blocks are spaced apart from each other in the ordered array by a distance s.

When 0.6 (w+s)<d<1.5 (w+s), a single unit polymer block is formed inside and self-aligned to the trench opening. For example, when w ranges from about 10 nm to about 50 nm and s ranges from about 10 nm to about 60 nm, d may range from about 40 nm to about 160 nm.

The annealing of the block copolymer is preferably, but not necessarily, conducted at a temperature from about 130° C. to about 230° C. The preferred annealing time is from about 40 minutes to about 80 minutes. The thickness of the block copolymer layer is preferably from about 15 nm to about 45 nm.

The block copolymer preferably comprises the first and second polymeric block components A and B at a weight ratio of from about 60:40 to about 40:60, and wherein the single unit polymer block comprises a lamella that stands perpendicular to the upper surface of said line structure.

Suitable block copolymers that can be used in the present invention include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-block-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

Other aspects, features and advantages of the invention will be more fully apparent from the ensuing disclosure and appended claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

Figure 1A:
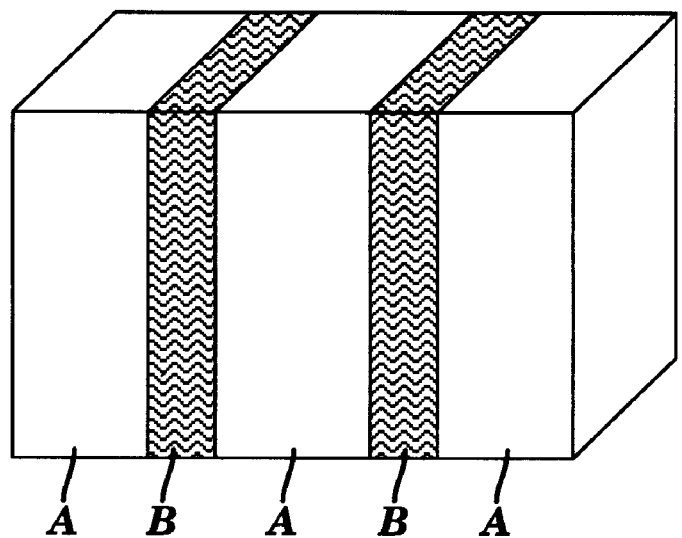
FIG. 1A shows a three-dimensional view of a pattern that is formed by a block copolymer with first and second polymeric block components A and B, while the pattern comprises an ordered array of lamellae composed of the polymeric block component B in a polymeric matrix composed of the polymeric block component A.

In describing the preferred embodiments of the present invention, reference will be made herein to FIGS. 1A-23B of the drawings in which like numerals refer to like features of the invention. Features of the invention are not necessarily shown to scale in the drawings.

It is understood that when an element, such as a layer, region or substrate, is referred to as being "on" or "over" another element, it can be directly on the other element or intervening elements may also be present.

The present invention combines the conventional photolithography technology with the copolymer self-assembling lithographic techniques to reduce tip-to-tip spacing between lines.

Specifically, a mask layer is first formed over the substrate containing a line structure. A trench opening is then created in the mask layer by conventional lithography and etch techniques. Such a trench opening has a relatively large width d which is consistent with the resolutions of the conventional lithography technology. It is preferred that the trench opening is above the line structure in the substrate and perpendicular to the line structure. A thin layer of a self-assembling block copolymer is then applied over the mask layer. The block copolymer layer preferably has a thickness ranging from about 10 nm to about 50 nm, more preferably from about 15 nm to about 45 nm. The self-assembling block copolymer is annealed to form an ordered pattern. The width of the trench opening is carefully selected so that only a single unit polymer block can be formed inside the trench opening. The single unit polymer block is embedded in a polymeric matrix and has a width or diameter of w which is smaller than the width of the trench opening. The single unit polymer block can be selectively removed to form a single opening of a width or diameter of w in the polymeric matrix inside the trench opening. The single opening can then be used as a mask to form an opening in the line structure in the substrate.

There are many different types of block copolymers that can be used for practicing the present invention. As long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of first and second polymeric block components A and B that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B.

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-block-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

Figure 1B:
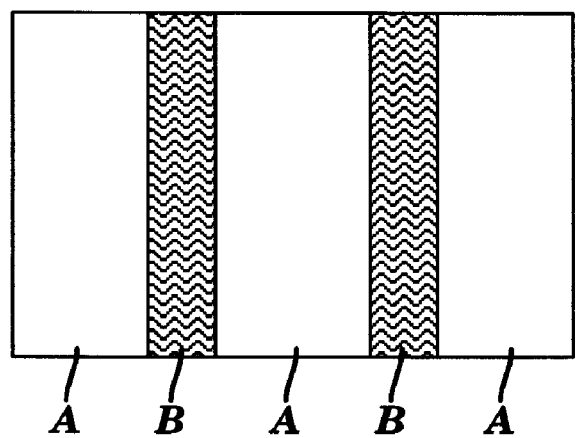
FIG. 1B shows the top view of the pattern of FIG. 1A.

In one preferred embodiment of the present invention, the ratio of the molecular weight of the first polymeric block component A over the molecular weight of the second polymeric block component B ranges from about 60:40 to about 40:60, so that the block copolymer of the present invention will form an ordered array of lamellae composed of the second polymeric block component B in a matrix composed of the first polymeric block component A, as shown in FIGS. 1A and 1B. Preferably, the second polymeric block component B can be selectively removable relative to the first polymeric block component A, thereby resulting in either isolated and orderly arranged structural units composed of the un-removed component, or a continuous structural layer containing isolated and orderly arranged cavities left by the removable component B.

In a particularly preferred embodiment of the present invention, the block copolymer used for forming the self-assembled periodic patterns of the present invention is PS-b-PMMA with a PS:PMMA molecular weight ratio ranging from about 60:40 to about 40:60.

Figure 2A:
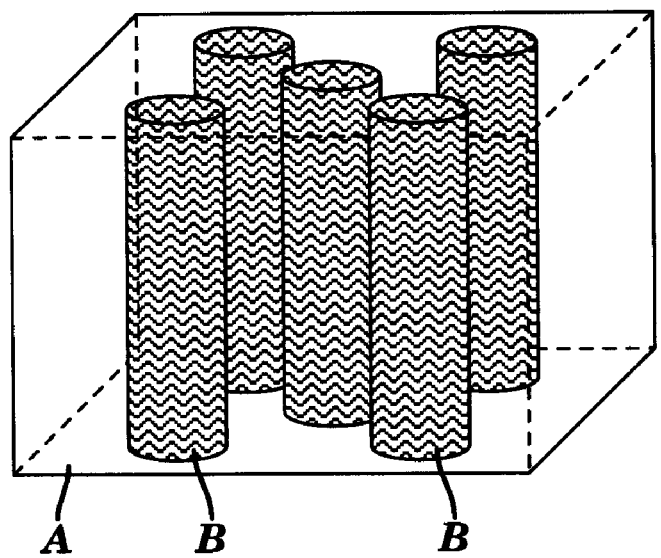
FIG. 2A shows a three-dimensional view of a pattern that is formed by a block copolymer with first and second polymeric block components A and B, while the pattern comprises an ordered array of cylinders composed of the polymeric block component B in a polymeric matrix composed of the polymeric block component A.
Figure 2B:
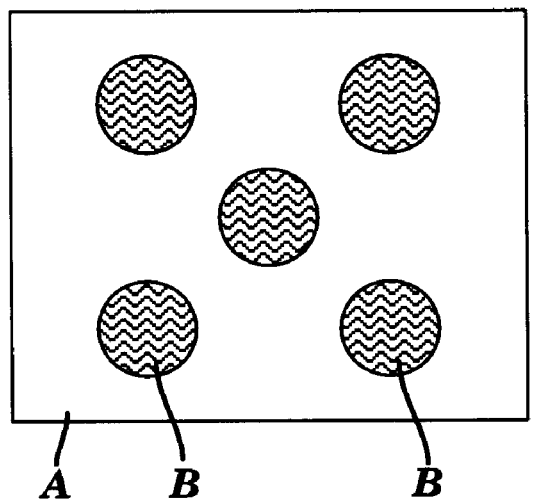
FIG. 2B shows the top view of the pattern of FIG. 4A.

In another preferred embodiment of the present invention, the ratio of the molecular weight of the first polymeric block component A over the molecular weight of the second polymeric block component B ranges from about 80:20 to about 60:40, so that the block copolymer of the present invention will form an ordered array of cylinders composed of the second polymeric block component B in a matrix composed of the first polymeric block component A, as shown in FIGS. 2A and 2B. Preferably, the second polymeric block component B can be selectively removable relative to the first polymeric block component A, thereby resulting in either isolated and orderly arranged structural units composed of the un-removed component, or a continuous structural layer containing isolated and orderly arranged cavities left by the removable component B.

In a particularly preferred embodiment of the present invention, the block copolymer used for forming the self-assembled periodic patterns of the present invention is PS-b-PMMA with a PS:PMMA molecular weight ratio ranging from about 80:20 to about 60:40.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %. In a particularly preferred embodiment of the present invention, the block copolymer solution comprises about 0.5 wt % to about 1.5 wt % PS-b-PMMA dissolved in toluene or PGMEA.

The block copolymer solution can be applied to the surface of a device structure by any suitable techniques, including, but not limited to: spin coating, spraying, ink coating, and dip coating. Preferably, the block copolymer solution is spin coated onto the surface of a substrate to form a thin block copolymer layer.

The substrate is then annealed to effectuate micro-phase segregation of the different block components contained by the block copolymer. Annealing of the self-assembling block copolymer in the present invention can be achieved by various methods known in the art, including, but not limited to: thermal annealing (either in a vacuum or in an inert atmosphere containing nitrogen or argon), ultra-violet annealing, laser annealing, solvent vapor-assisted annealing, or supercritical fluid-assisted annealing.

In a preferred embodiment of the present invention, a thermal annealing step is carried out to anneal the block copolymer layer at an elevated annealing temperature that is above the glass transition temperature ($T_g$) of the block copolymer, but below the decomposition or degradation temperature ($T_d$) of the block copolymer. Preferably, the thermal annealing step is carried out at an annealing temperature of about 100° C. to about 250° C. More preferably, the annealing temperature is from about 130° C. to about 230° C. The thermal annealing may last from about 30 minutes to about 10 hours, more preferably, from about 40 minutes to about 80 minutes.

Figure 3:
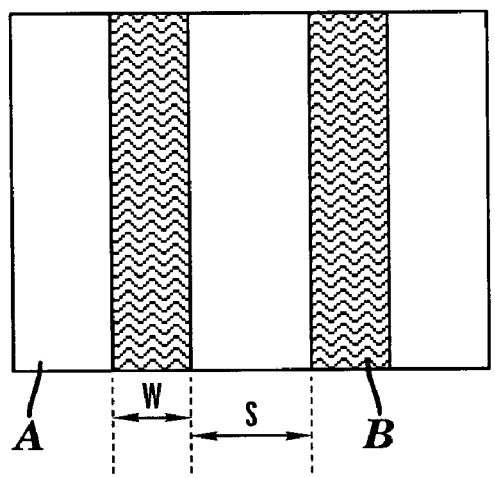
FIG. 3 illustrates the dimensions of the ordered array of lamellae and the relative dimensions of a lithographic feature that can be used for precise placement of a single cylinder.
Figure 4:
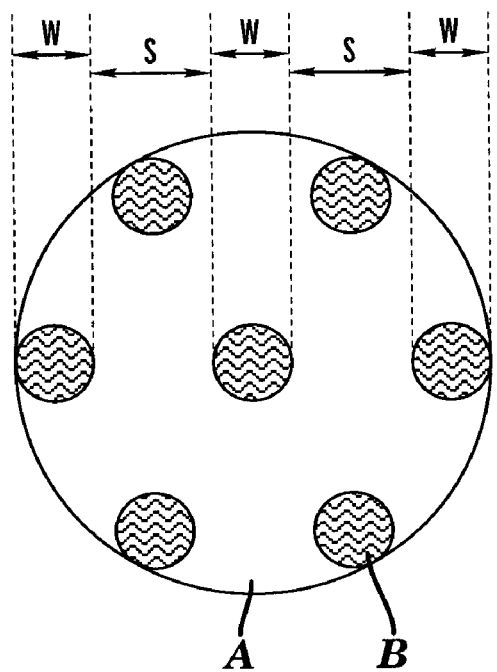
FIG. 4 illustrates the dimensions of the ordered array of cylinders and the relative dimensions of a lithographic feature that can be used for precise placement of a single cylinder.

The block copolymer, when applied and annealed on a planar surface, self-assembles into an ordered array of multiple structural units comprising said polymeric block component B embedded in a polymeric matrix comprising said first polymeric block component A. Each of said multiple structural units has a width or diameter w and is spaced apart from each other in the ordered array by a distance s (FIGS. 3 and 4).

In the present invention, the dimension of the trench opening in the mask layer is adjusted so that only a single unit polymer block can be formed and placed inside the trench opening from the self-assembling block copolymer. In order to achieve formation and placement of such a single structure unit inside the trench opening, it is preferred that the width of the trench opening d is more than 0.6 (w+s), but less than 1.5 (w+s). For example, when w ranges from about 10 nm to about 50 nm and s ranges from about 10 nm to about 60 nm, d may range from about 40 nm to about 160 nm.

FIGS. 5A-13B are cross-sectional and top views that illustrate exemplary processing steps for reducing tip-to-tip spacing between lines according to one embodiment of the present invention.

Figure 5A:
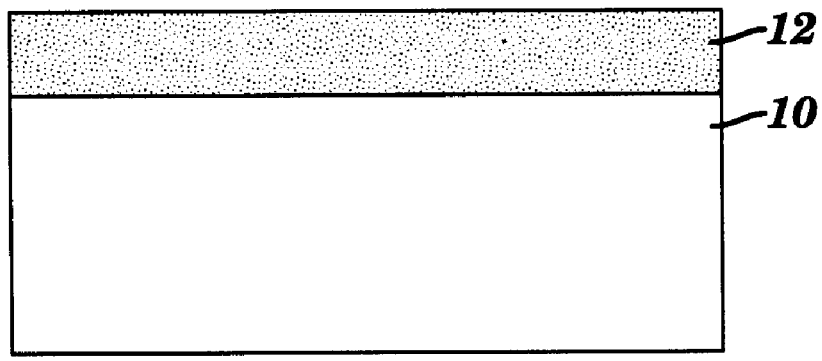
FIGS. 5A-13B are cross-sectional and top views that illustrate exemplary processing steps for reducing tip-to-tip spacing between lines according to one embodiment of the present invention.
Figure 5B:
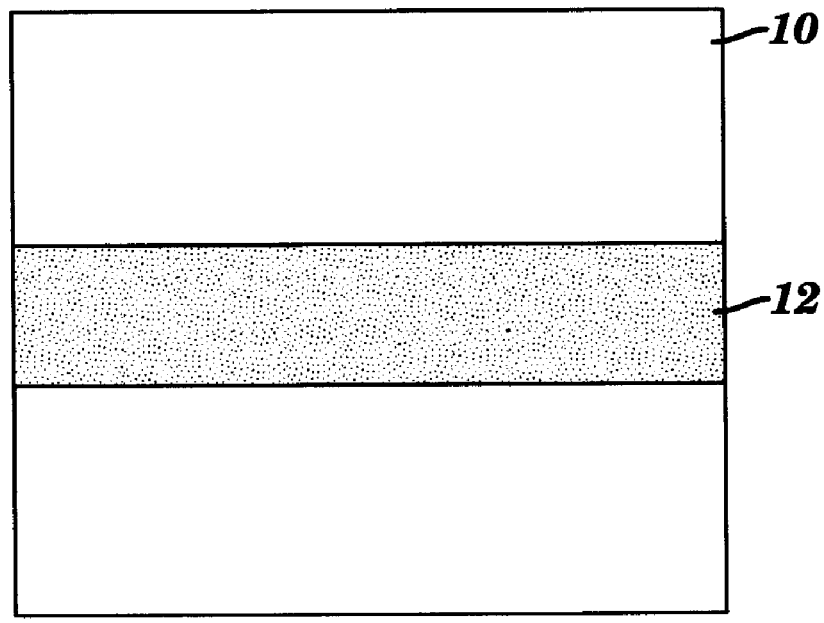

FIG. 5A shows the cross-sectional view of a substrate 10 with a line structure 12 on it. The cross-section site is across the line structure, as shown in FIG. 5B. The line structure is formed by any conventional lithography techniques. Preferably, the line structure is a gate line structure. The substrate in the present invention is suitably any substrate conventionally used in lithography processes. For example, the substrate can be silicon, silicon oxide, aluminum-aluminum oxide, gallium arsenide, ceramic, quartz, copper or any combination thereof including multilayers.

Figure 6A:
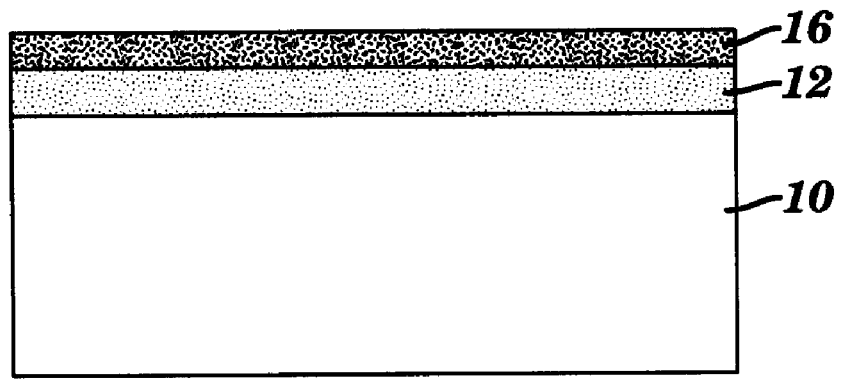
Figure 6B:
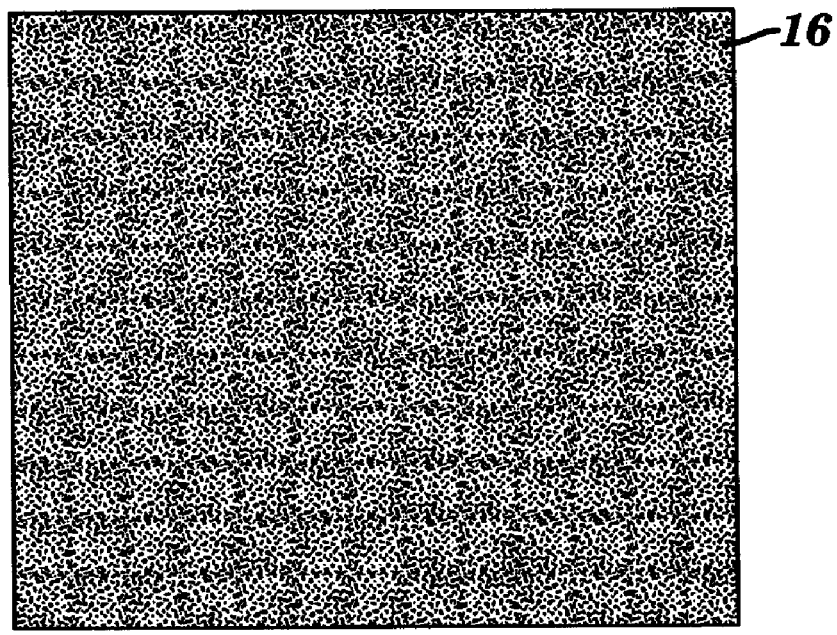

A mask layer 16 is formed over the substrate 10, as shown in FIGS. 6A and 6B. The mask layer 16 may comprise any suitable organic or inorganic photosensitive materials that can be patterned by conventional lithography techniques. In a preferred embodiment, mask layer 16 is a photoresist. More preferably, mask layer 16 is a Si-containing photoresist. The mask layer may be applied by virtually any standard means including spin coating. The mask layer may be baked (PAB) to remove any solvent and improve the coherence of the mask layer. The preferred range of the PAB temperature is from about 70° C. to about 150° C., more preferably from about 90° C. to about 130° C. A typical bake time is from about 60 seconds to about 90 seconds. The preferred range of thickness of the mask layer is from about 20 nm to about 400 nm, more preferably from about 50 nm to about 300 nm.

Figure 7A:
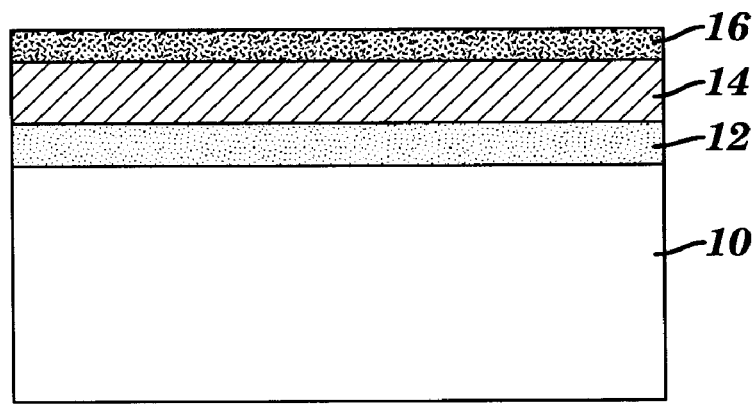
Figure 7B:
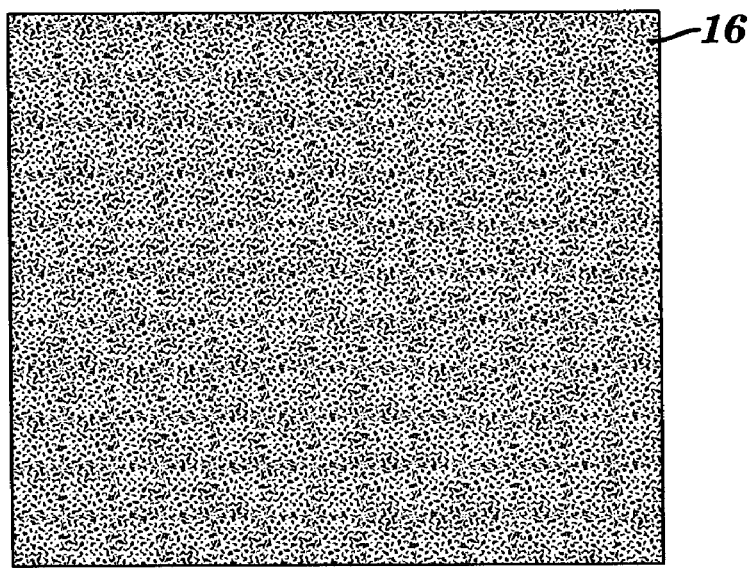

Optionally, but not necessarily, an underlayer 14 may be applied over the substrate 10 with the line structure 12 before the mask layer 16 is formed, as shown in FIGS. 7A and 7B. The underlayer 14 is a planarizing layer used for leveling the topography of the substrate. Both organic and inorganic planarizing materials commonly used in photolithographic processes can be used in forming the underlayer 14. The thickness of the underlayer 14 is preferably from about 50 nm to about 300 nm.

Figure 8A:
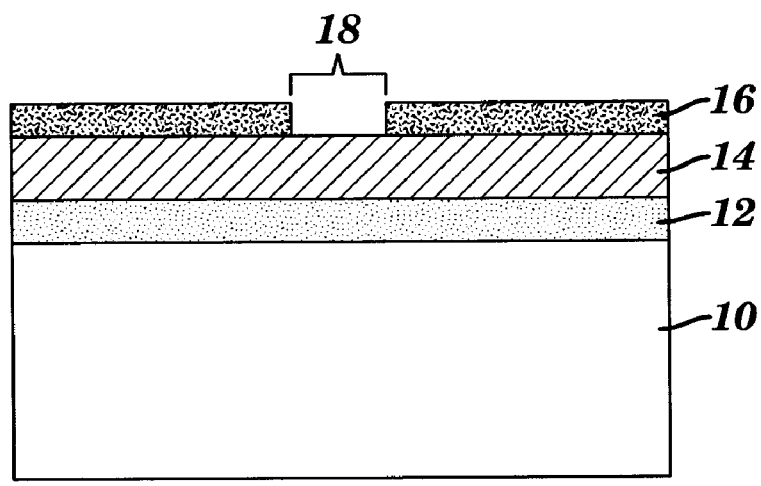
Figure 8B:
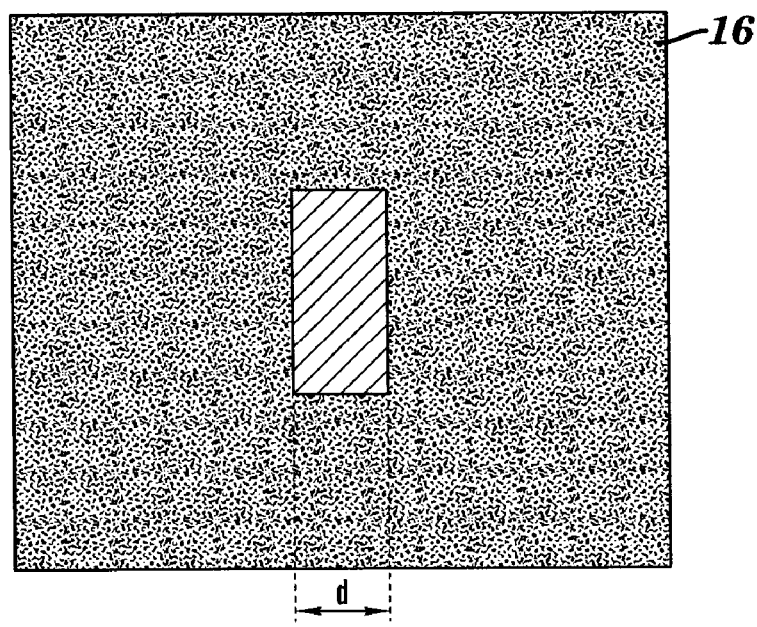

Next, a lithographic process is performed over the mask layer 16 to create a trench opening 18 in the mask layer, and the upper surface of the underlayer 14 is exposed through the trench opening 18. The lithographic process involves conventional lithography and resist development steps. Specifically, the mask layer 16 is first exposed to a desired pattern of radiation (not shown). The exposed mask layer 16 is then developed in a conventional resist developer to form the trench opening 18 in the mask layer 16. The trench opening 18 has a width d that ranges from about 30 nm to about 200 nm, more preferably from about 40 nm to about 160 nm. It is preferred that the trench opening is above the line structure 12 in the substrate 10 and perpendicular to the line structure 12, as shown in FIGS. 8A and 8B.

Optionally, but not necessarily, the interior surfaces of the trench opening 18 are treated before the application of a layer of a block copolymer to adjust the surface affinities of a specific surface to the different block components of the block copolymer. Specifically, one or more surface layers are formed over the bottom surface and/or sidewall surfaces of the trench opening 18. These surface layers can provide the desired surface affinities for aligning the lamellar or cylindrical unit polymeric block formed by the block copolymer layer inside the trench opening 18.

If a surface has substantially the same surface affinity to both block components A and B of a block copolymer, such a surface is considered a neutral surface or a non-preferential surface, i.e., both block components A and B can wet such a surface. In contrast, if a surface has significantly different surface affinities for the block components A and B, such a surface is then considered a preferential surface, i.e., only one of block components A and B can wet such a surface, but the other cannot. For example, surfaces comprising one of silicon native oxides, silicon oxides, and silicon nitrides are preferentially wetted by PMMA block components, but not by PS block components. Therefore, such surfaces can be used as preferential surfaces for PS-b-PMMA block copolymers. On the other hand, a monolayer comprising a substantially homogenous mixture of PS and PMMA components, such as a random PS-r-PMMA copolymer layer, provides a neutral surface or a non-preferential surface for PS-b-PMMA block copolymers.

Figure 9A:
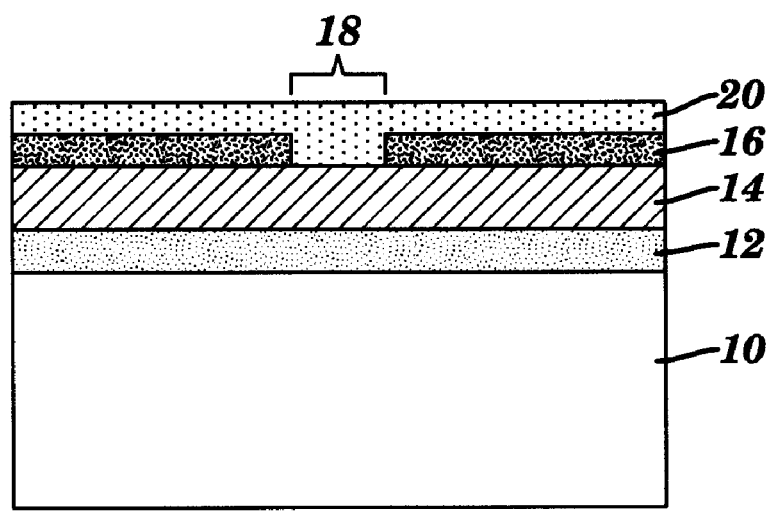
Figure 9B:
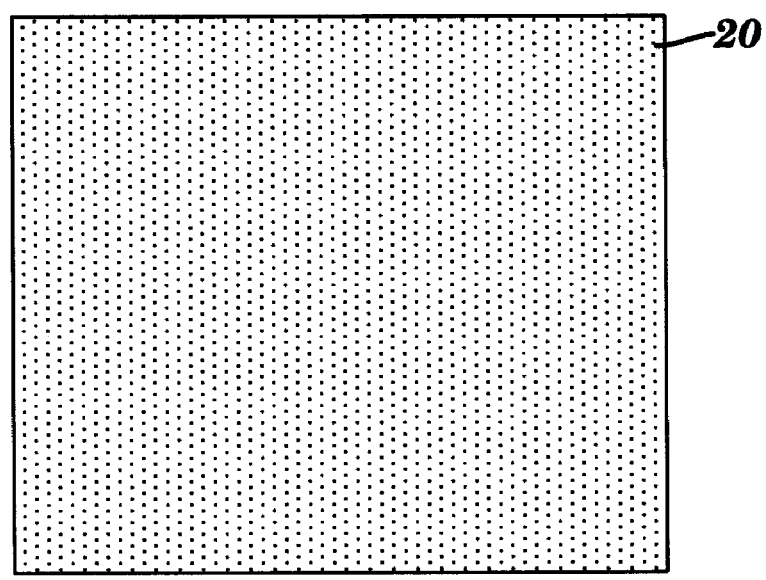

In order to form lamellar polymeric blocks that are aligned perpendicular to the bottom surface of the trench opening 18 from PS-b-PMMA, it is desired to deposit a neutral or non-preferential monolayer (e.g., a substantially homogenous mixture of PS and PMMA components) over the bottom surface of the trench opening 18, while the sidewall surfaces of the trench opening 18, which preferably comprise silicon nitrides or oxides, are either left untreated or are coated with a preferential wetting material (e.g., silicon native oxides, silicon oxides, and silicon nitrides). In this manner, the lamellar polymeric blocks formed from PS-b-PMMA will stand perpendicular to the bottom surface of the trench opening 18 and also perpendicular to the upper surface of said line structure A thin layer of a self-assembling block copolymer 20 is applied over the mask layer 16, including the trench opening 18, as shown in FIGS. 9A and 9B. The block copolymer layer 20 preferably has a thickness that ranges from about 10 nm to about 50 nm, more preferably from about 15 nm to about 45 nm.

Figure 10A:
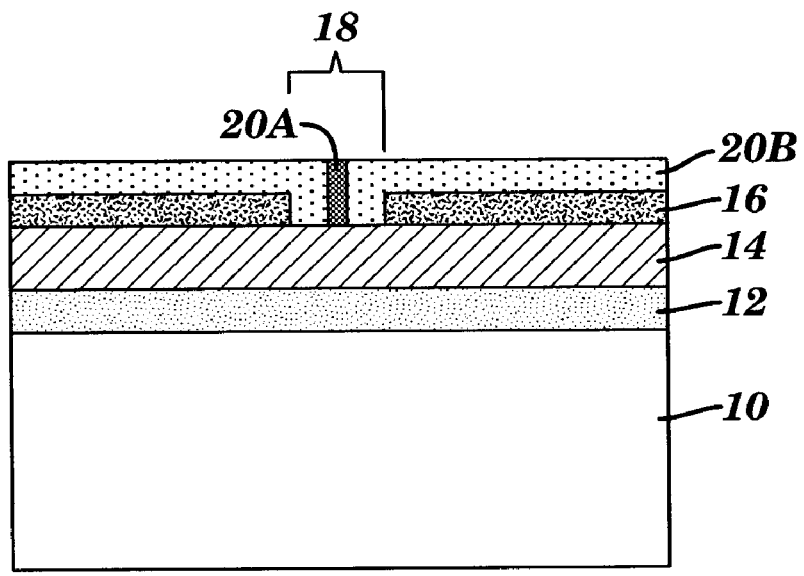
Figure 10B:
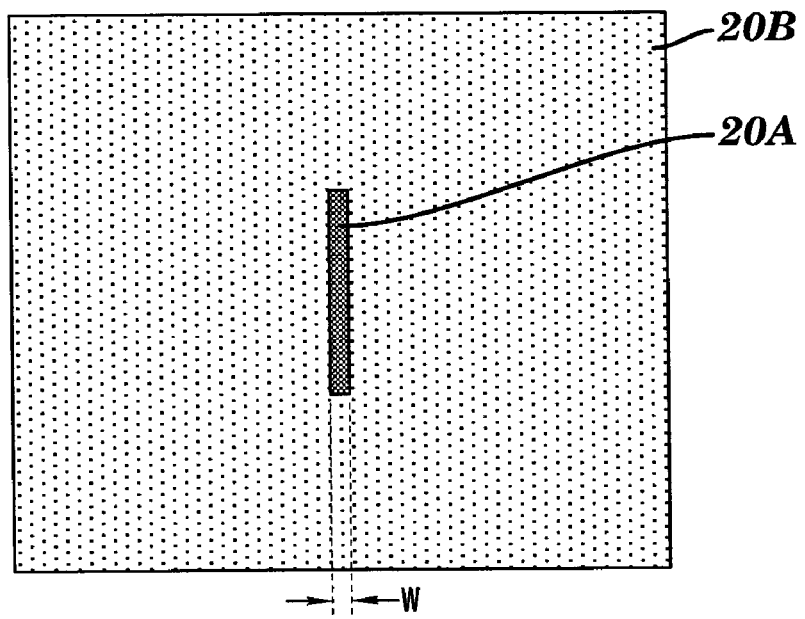

In a preferred embodiment, the block copolymer layer 20 is a diblock copolymer comprising a first and a second polymeric block components A and B with a molecular weight ratio ranging from about 60:40 to about 40:60. More preferably, the block copolymer layer 20 is a PS-b-PMMA block copolymer with a PS:PMMA molecular weight ratio ranging from about 60:40 to about 40:60. Such a PS-b-PMMA block copolymer, when applied and annealed on a planar surface, self-assembles into an ordered array of PMMA lamellae in a PS matrix. However, because of the trench opening 18 of the width d in the mask layer 16, annealing of the block copolymer layer 20 results in only a single PMMA lamella 20A embedded in a PS matrix 20B inside the trench opening 18, as shown in FIGS. 10A and 10B. The PMMA lamella 20A has a width w which is smaller than the width d and ranges from about 5 nm to about 60 nm, preferably from about 10 nm to about 50 nm.

Figure 11A:
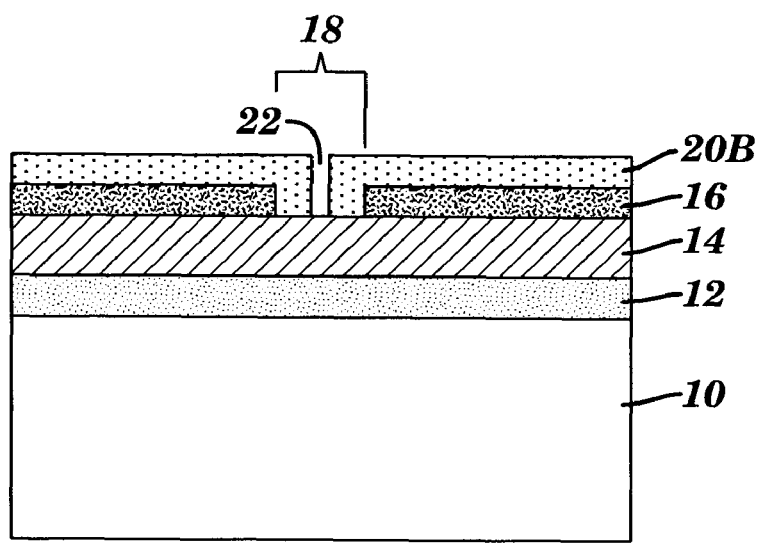
Figure 11B:
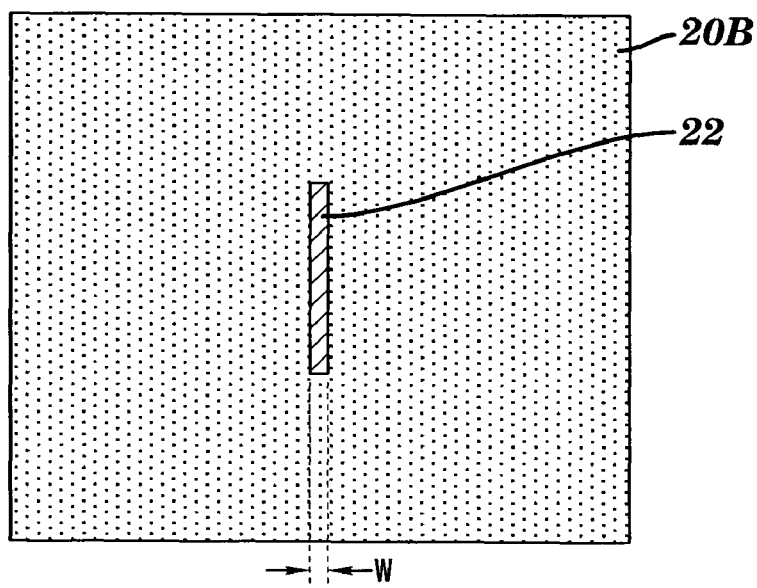

Next, the single lamella 20A is selectively removed to form the single opening 22 of the width w, as shown in FIGS. 11A and 11B. For example, when the block copolymer layer 20 is a PS-b-PMMA block copolymer, the single lamella 20A can be selectively removed by immersing the entire structure as shown in FIGS. 10A and 10B in an acetic acid aqueous solution containing about 62% of acetic acid for a duration of about 1 minute.

Figure 12A:
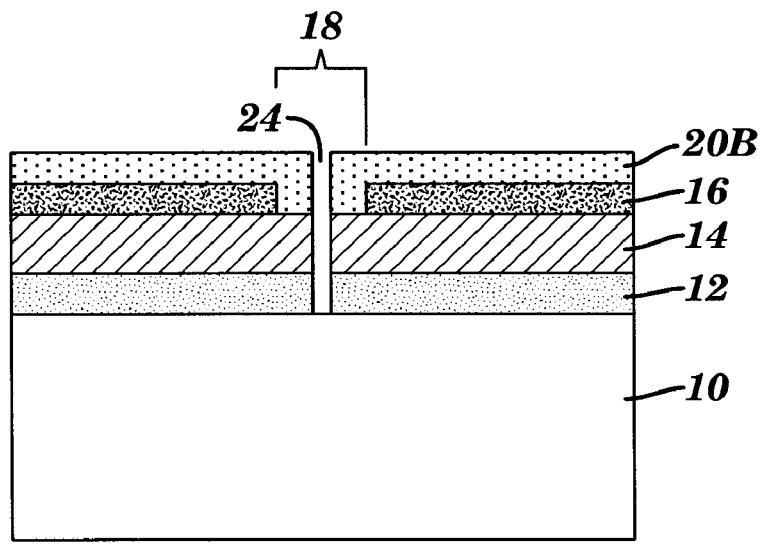
Figure 12B:
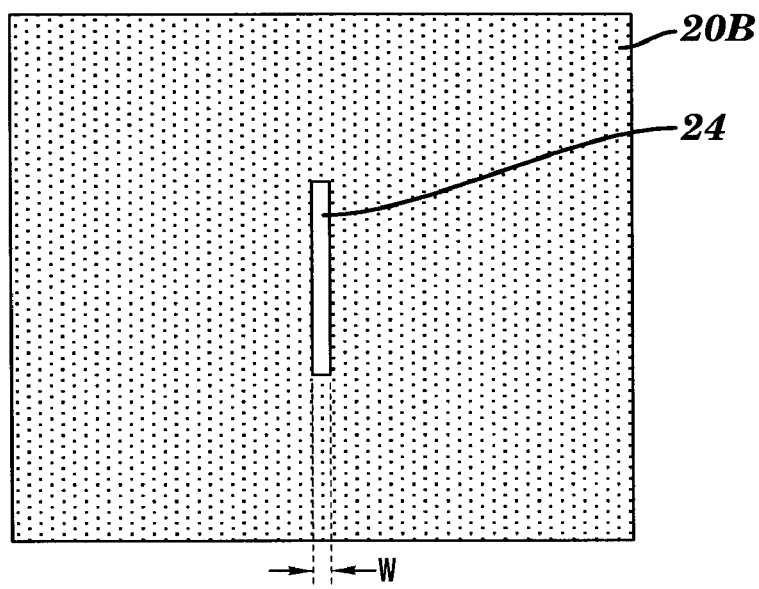

The single opening 22 is then used as a mask in an etch transfer process to form an opening 24 in the line structure 12, exposing the upper surface of the substrate 10, as shown in FIGS. 12A and 12B. The etch transfer process may involve one or more dry or wet etch steps. It is possible that the entire or part of the block copolymer layer 20, the mask layer 16 and the underlayer 14 are removed during the etch transfer process.

Figure 13A:
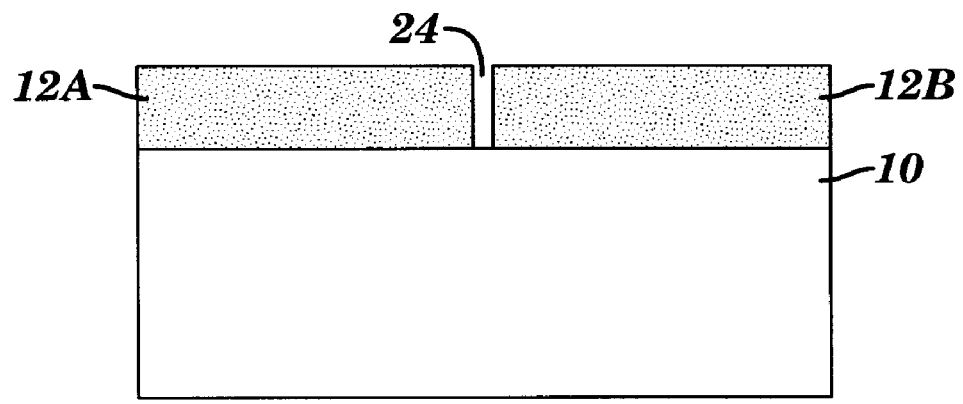
Figure 13B:
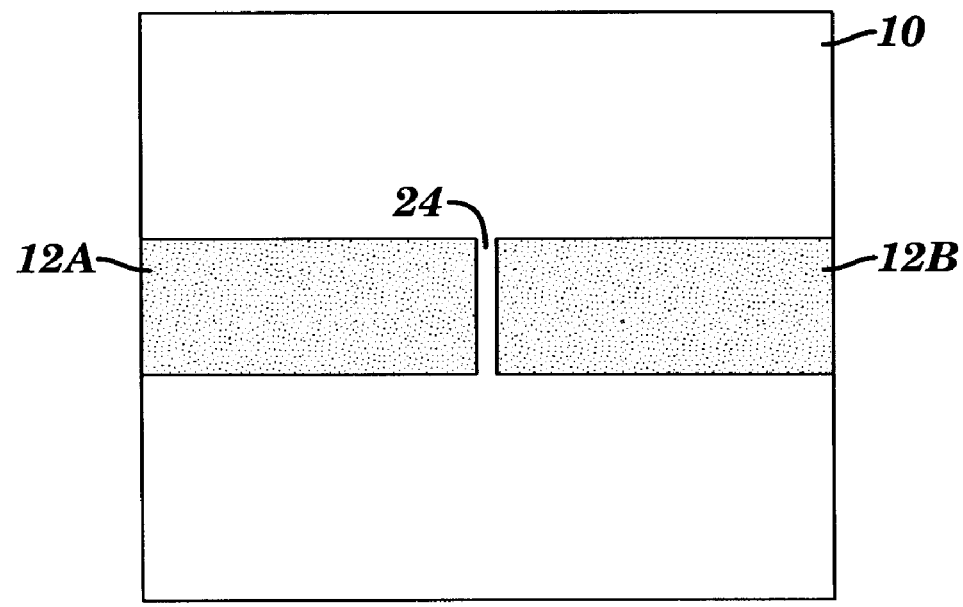

Any remaining block copolymer layer 20, mask layer 16 and underlayer 14 after performing the etch process is stripped from the substrate, exposing the line structure 12 and the upper surface of the substrate 10 not covered by the line structure 12, as shown in FIGS. 13A and 13B. The opening 24 cuts the line structure 12 into two lines 12A and 12B. The tip-to-tip spacing between these two lines 12A and 12B is thus the width of the opening 24. Since the single opening 22 has a width w in the range from about 5 nm to about 60 nm, preferably from about 10 nm to about 50 nm, the width of the opening 24 is also in the similar range. Such a small tip-to-tip spacing between these two lines 12A and 12B cannot be formed by the conventional lithography techniques.

FIGS. 14A-23B are cross-sectional and top views that illustrate exemplary processing steps for reducing tip-to-tip spacing between lines according to another embodiment of the present invention. This embodiment involves many steps that are the same as those in the previous embodiment, as illustrated in FIGS. 5A-13B.

Figure 14A:
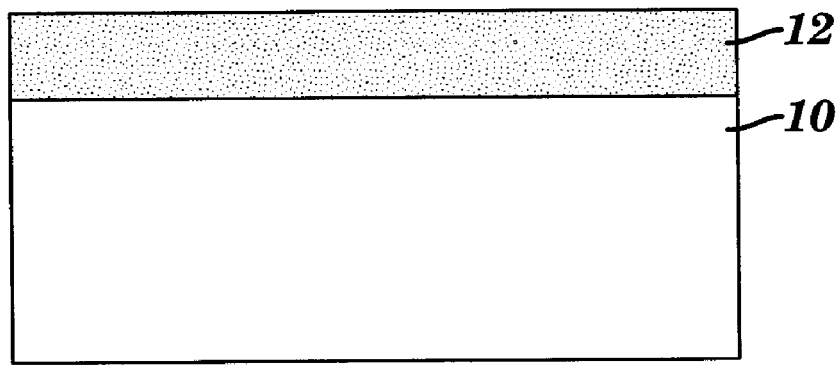
FIGS. 14A-23B are cross-sectional and top views that illustrate exemplary processing steps for reducing tip-to-tip spacing between lines according to another embodiment of the present invention.
Figure 14B:
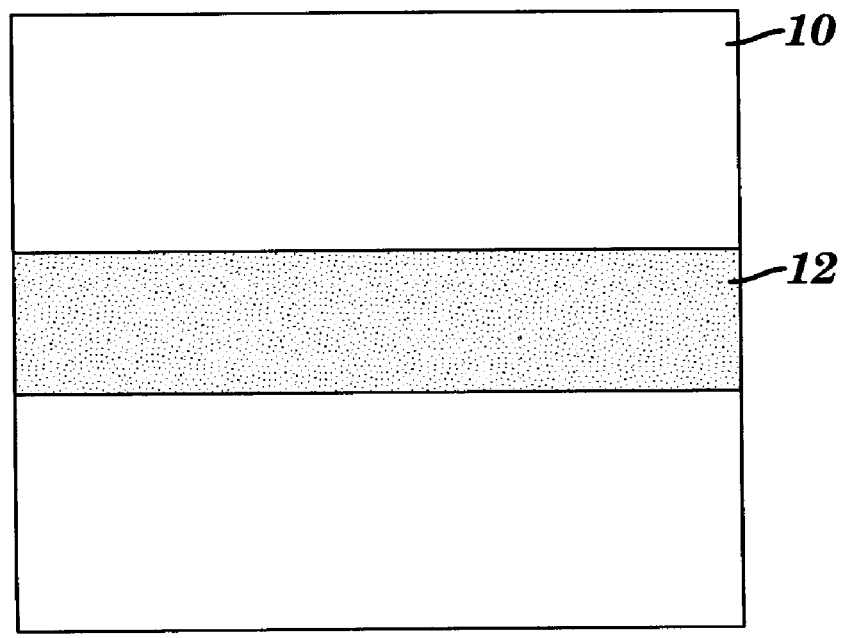

FIG. 14A shows the cross-sectional view of a substrate 10 with a line structure 12 on it. The cross-section site is across the line structure, as shown in FIG. 14B.

Figure 15A:
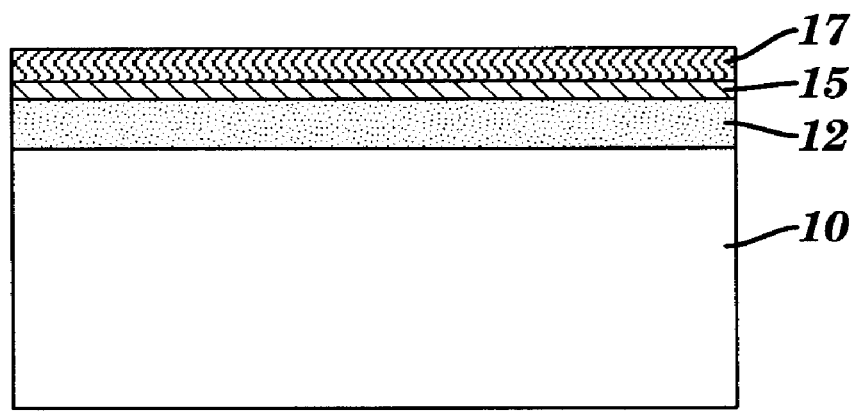
Figure 15B:
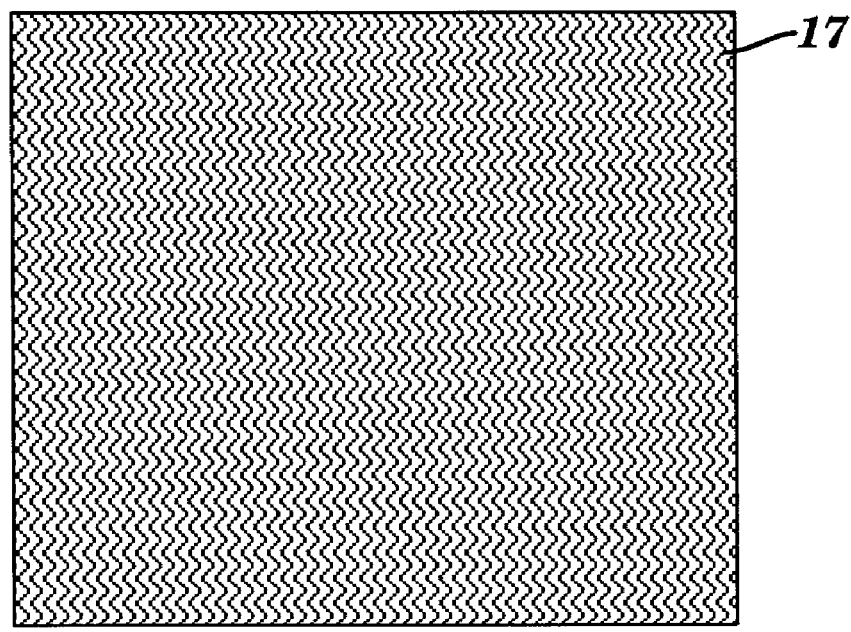

A first mask layer 15 is formed over the substrate 10 and a second mask layer 17 is formed over the first mask layer 15, as shown in FIGS. 15A and 15B. The first mask layer 15 may comprise any suitable mask material, such as an oxide, nitride, or oxynitride, and it can be deposited by well known techniques such as chemical vapor deposition (CVD), plasma-assisted CVD, atomic layer deposition (ALD), evaporation, reactive sputtering, chemical solution deposition and other like deposition processes. Preferably, the first mask layer 15 comprises silicon nitride and is deposited by a CVD process.

The second mask layer 17 may comprise any suitable organic or inorganic photosensitive materials that can be patterned by conventional lithography techniques. In a preferred embodiment, the second mask layer 17 is a photoresist. The second mask layer 17 may be applied by virtually any standard means including spin coating. The second mask layer 17 may be baked (PAB) to remove any solvent and improve the coherence of the mask layer. The preferred range of the PAB temperature is from about 70° C. to about 150° C., more preferably from about 90° C. to about 130° C. A typical bake time is from about 60 seconds to about 90 seconds. The preferred range of thickness of the second mask layer 17 is from about 20 nm to about 400 nm, more preferably from about 50 nm to about 300 nm.

Figure 16A:
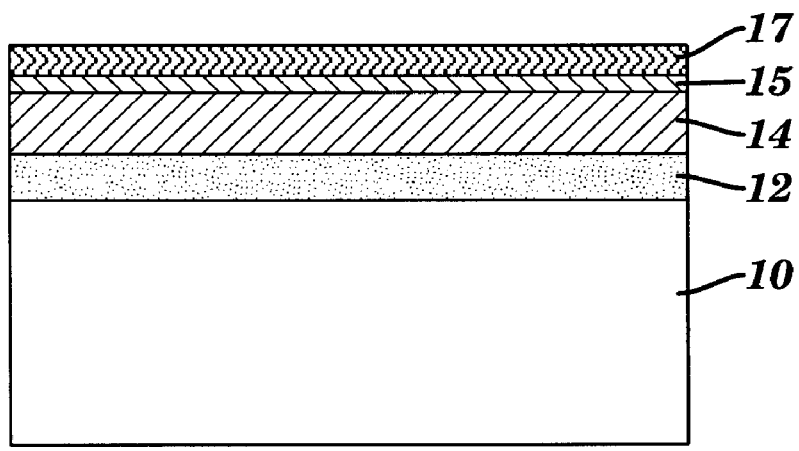
Figure 16B:
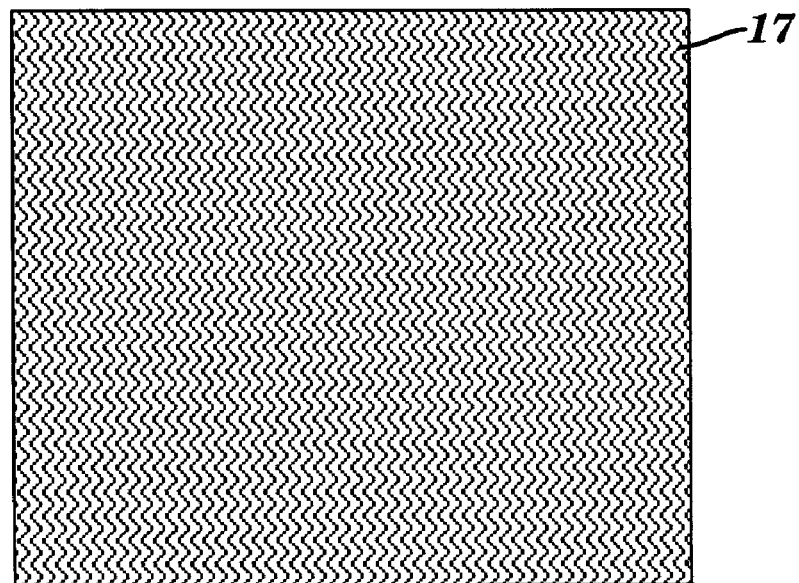

Optionally, but not necessarily, an underlayer 14 may be applied over the substrate 10 with the line structure 12 before the first mask layer 15 is formed, as shown in FIGS. 16A and 16B.

Figure 17A:
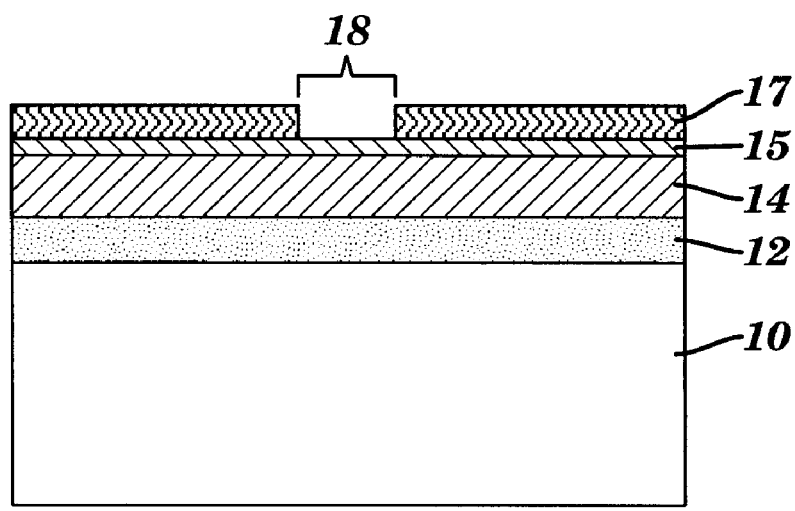
Figure 17B:
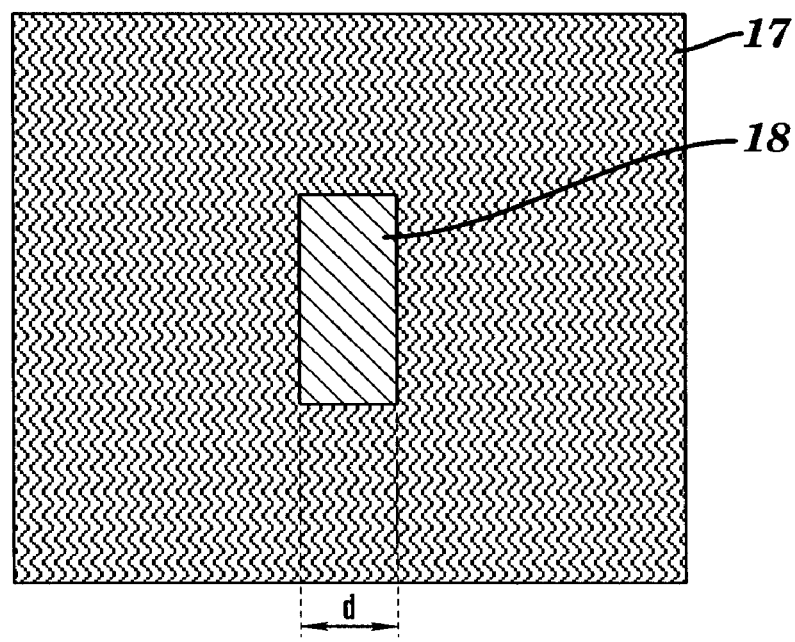

Next, a lithographic process is performed over the second mask layer 17 to create a trench opening 18 in the mask layer, and the upper surface of the first mask layer 15 is exposed through the trench opening 18. The lithographic process involves conventional lithography and resist development steps. The trench opening 18 has a width d that ranges from about 30 nm to about 200 nm, more preferably from about 40 nm to about 160 nm. It is preferred that the trench opening is above the line structure 12 in the substrate 10 and perpendicular to the line structure 12, as shown in FIGS. 17A and 17B.

Optionally, but not necessarily, the interior surfaces of the trench opening 18 are treated before the application of a layer of a block copolymer to adjust the surface affinities of a specific surface to the different block components of the block copolymer, as described in the previous embodiment.

Figure 18A:
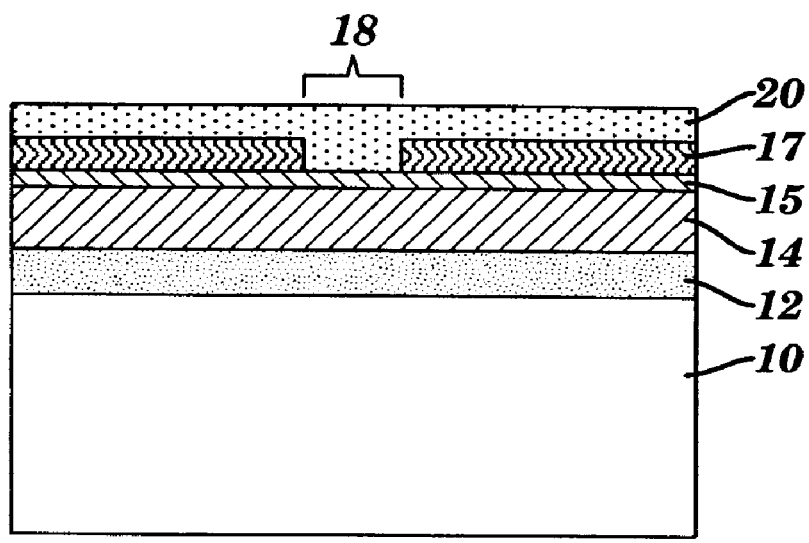
Figure 18B:
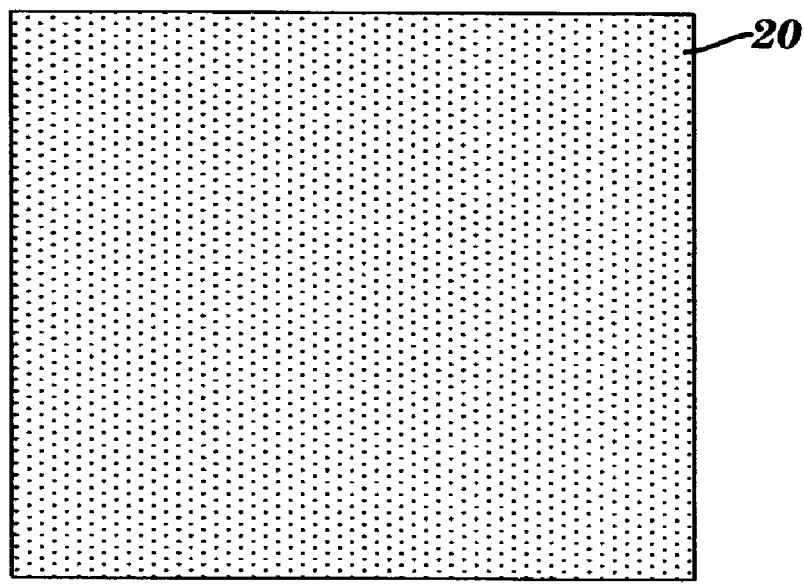

A thin layer of a self-assembling block copolymer 20 is applied over the second mask layer 17, including the trench opening 18, as shown in FIGS. 18A and 18B. The block copolymer layer 20 preferably has a thickness that ranges from about 10 nm to about 50 nm, more preferably from about 15 nm to about 45 nm.

Figure 19A:
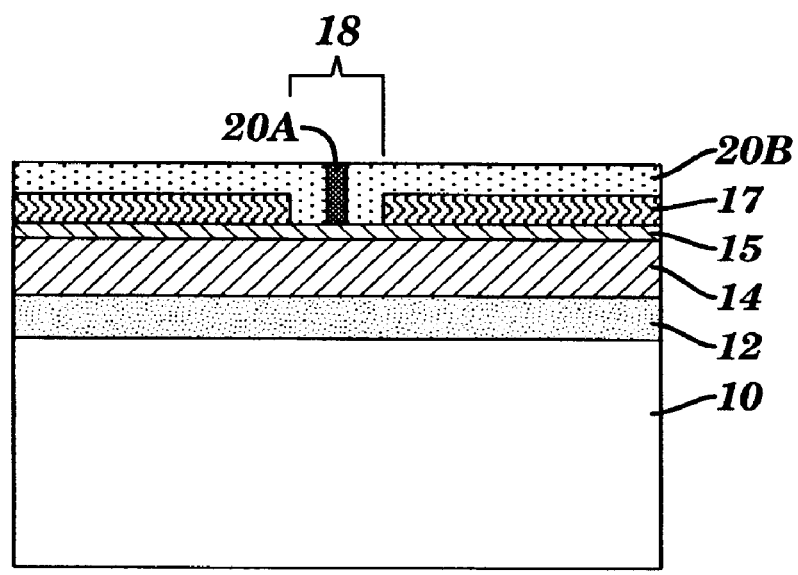
Figure 19B:
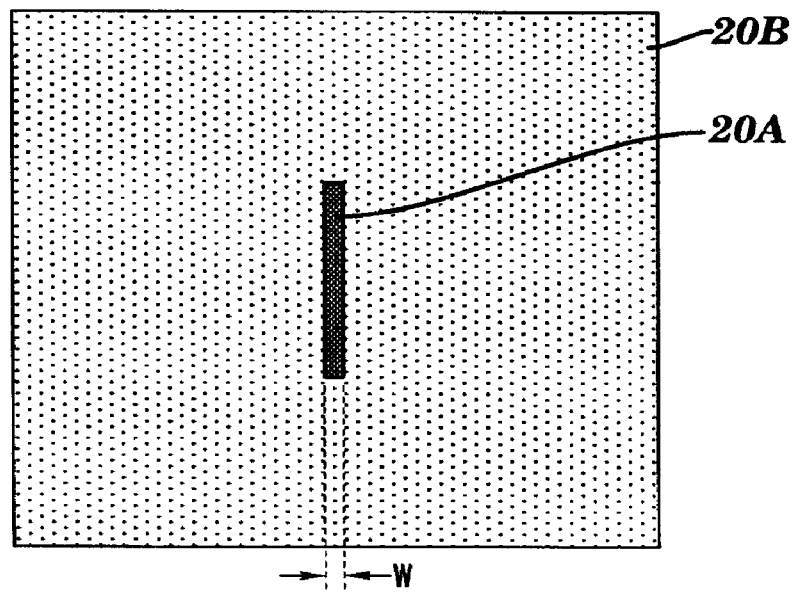

In a preferred embodiment, the block copolymer layer 20 is a diblock copolymer comprising a first and a second polymeric block components A and B with a molecular weight ratio ranging from about 60:40 to about 40:60. More preferably, the block copolymer layer 20 is a PS-b-PMMA block copolymer with a PS:PMMA molecular weight ratio ranging from about 60:40 to about 40:60. Because of the trench opening 18 of the width d in the second mask layer 17, annealing of the block copolymer layer 20 results in only a single PMMA lamella 20A embedded in a PS matrix 20B inside the trench opening 18, as shown in FIGS. 19A and 19B. The PMMA lamella 20A has a width w which is smaller than the width d and ranges from about 5 nm to about 60 nm, preferably from about 10 nm to about 50 nm.

Figure 20A:
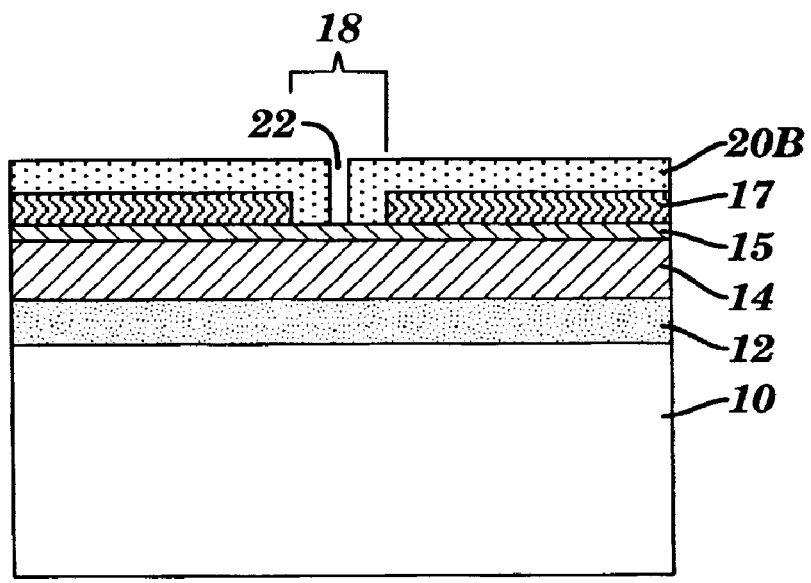
Figure 20B:
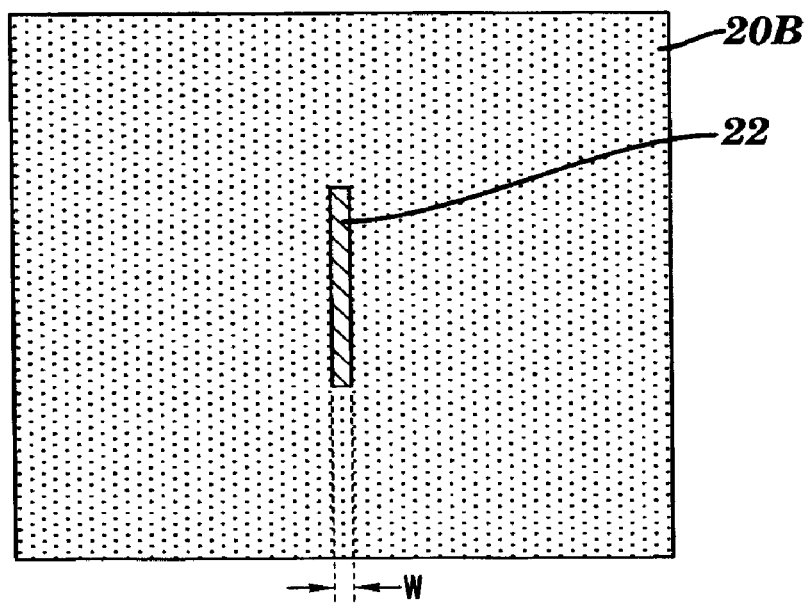

The single lamella 20A is selectively removed to form the single opening 22 of the width w in the matrix 20B, as shown in FIGS. 20A and 20B.

Figure 21A:
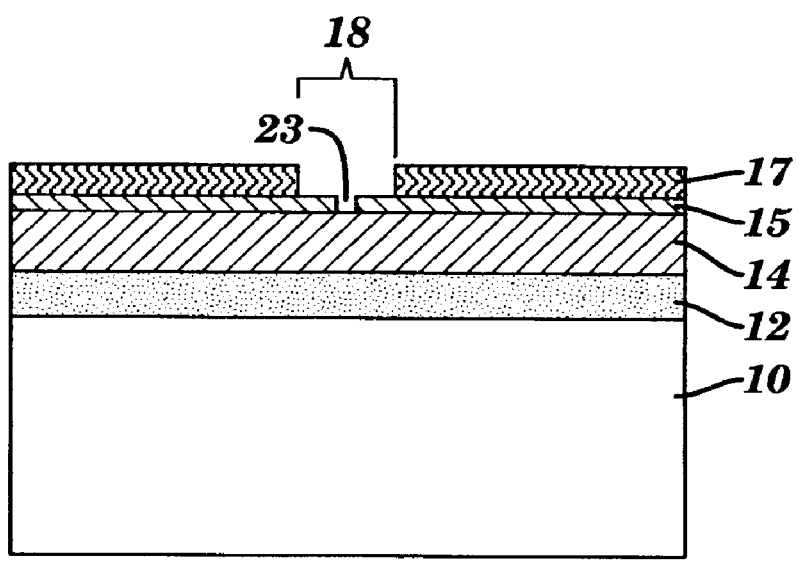
Figure 21B:
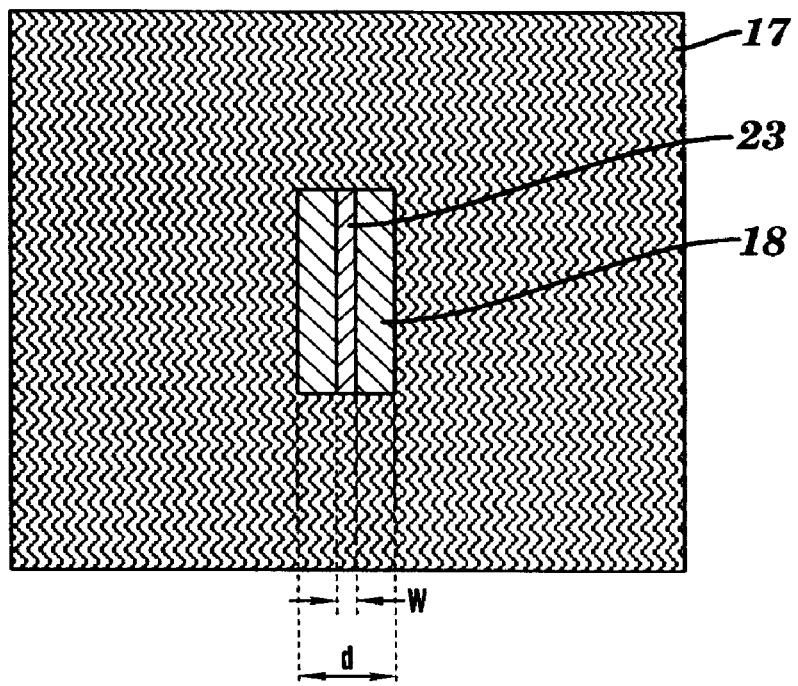

The single opening 22 is then used as a mask in a first etch transfer process to form an opening 23 in the first mask layer 15, as shown in FIGS. 21A and 21B. The first etch transfer process may involve one or more dry or wet etch steps. It is possible that the entire or part of the block copolymer layer 20 and the second mask layer 17 are removed during the etch transfer process.

Figure 22A:
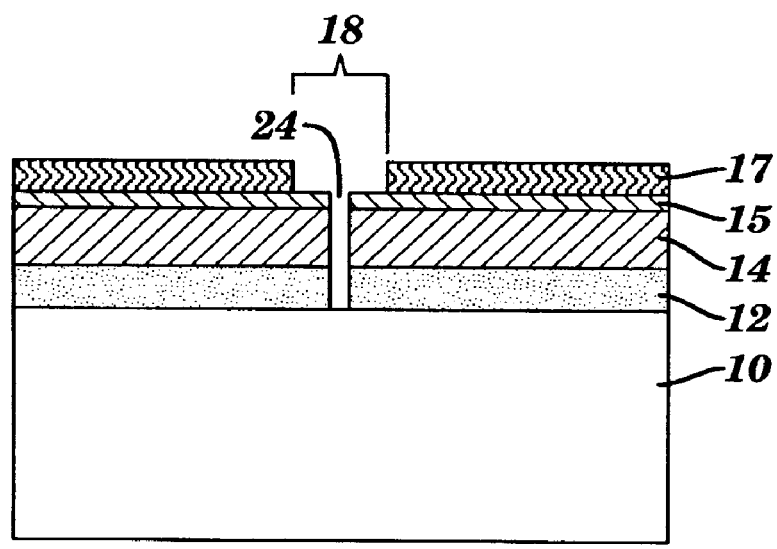
Figure 22B:
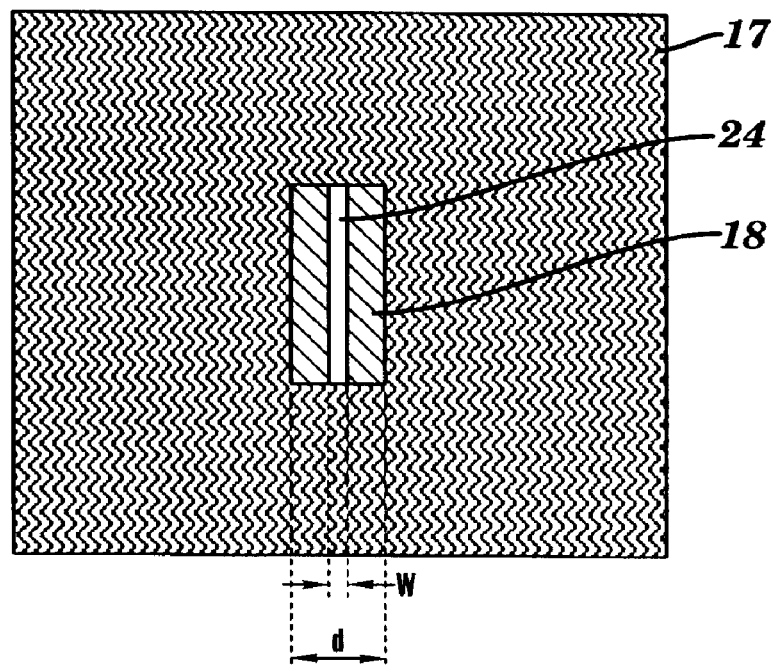

In a second etch transfer process, the opening 23 is used as a mask to form an opening 24 in the line structure 12, exposing the upper surface of the substrate 10, as shown in FIGS. 22A and 22B. The etch transfer process may involve one or more dry or wet etch steps. It is possible that the entire or part of the block copolymer layer 20, the second mask layer 17, the first mask layer 15 and the underlayer 14 are removed during the etch transfer process.

Figure 23A:
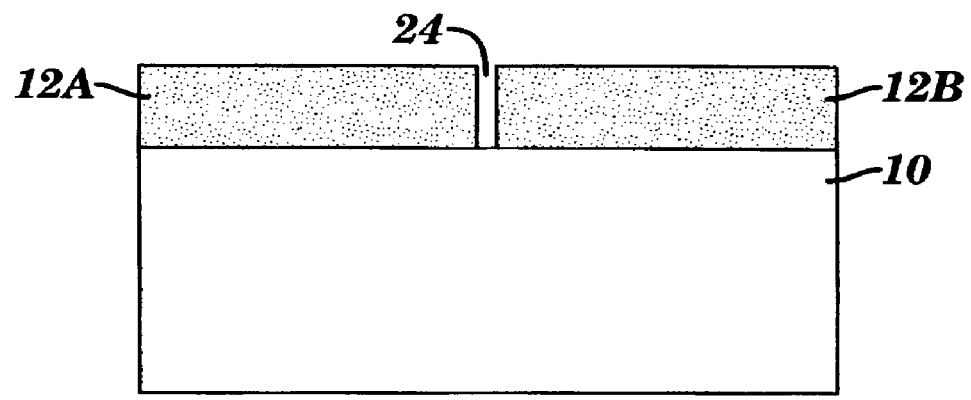
Figure 23B:
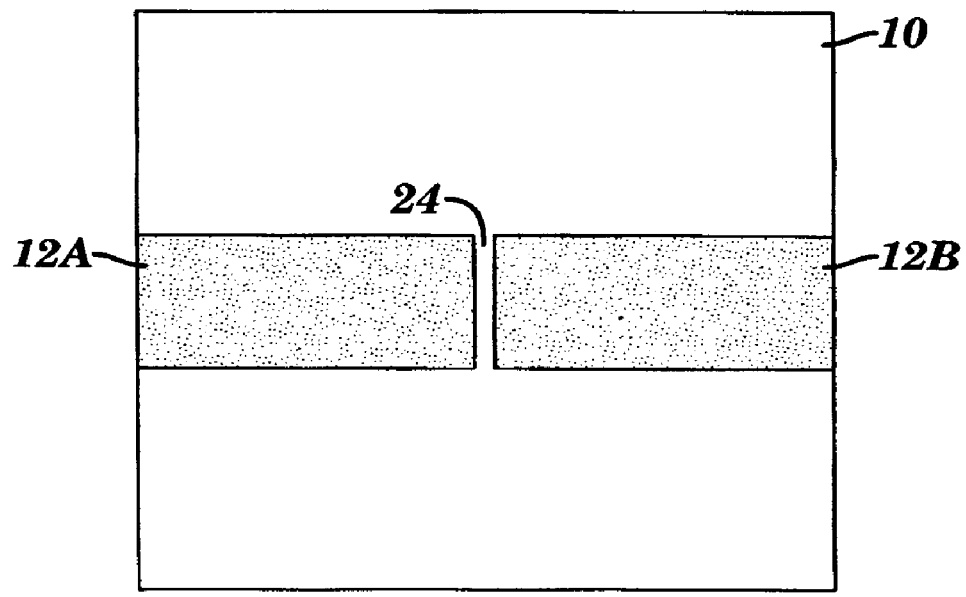

Any remaining block copolymer layer 20, the second mask layer 17, the first mask layer 15 and the underlayer 14 after performing the etch process is stripped from the substrate, exposing the line structure 12 and the upper surface of the substrate 10 not covered by the line structure 12, as shown in FIGS. 23A and 23B. As described in the previous embodiment, the opening 24 cuts the line structure 12 into two lines 12A and 12B. The tip-to-tip spacing between these two lines 12A and 12B is thus the width of the opening 24 which ranges from about 5 nm to about 60 nm, preferably from about 10 nm to about 50 nm.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method for reducing tip-to-tip spacing between lines comprising:
   providing a substrate and a line structure in said substrate;
   forming a mask layer over said substrate;
   performing a lithographic process over said mask layer to create a trench opening of a width d in said mask layer, wherein said trench opening is above said line structure in said substrate and substantially perpendicular to said line structure;
   applying a layer of a block copolymer over said mask layer, wherein said block copolymer comprises at least first and second polymeric block components A and B respectively that are immiscible with each other;
   annealing said block copolymer layer to form a single unit polymer block of a width or a diameter w inside said trench opening, wherein w<d, and wherein said single unit polymer block comprises said polymeric block component B and is embedded in a polymeric matrix that comprises said first polymeric block component A;

selectively removing said second polymeric block component B to form a single opening of a width or a diameter w in said polymeric matrix inside said trench opening; and performing an etch transfer process using said single opening as a mask to form a third opening in said line structure in said substrate, wherein said third opening cuts said line structure into two lines.

2. The method of claim 1, further comprising forming an underlayer over said substrate, before forming said mask layer.

3. The method of claim 2, further comprising stripping any remaining block copolymer layer, mask layer and underlayer, after said etch transfer process.

4. The method of claim 1, wherein said annealing is performed at a temperature from about 130° C. to about 230° C.

5. The method of claim 4, wherein said annealing is performed from about 40 minutes to about 80 minutes.

6. The method of claim 1, wherein said block copolymer layer has a thickness from about 15 nm to about 45 nm.

7. The method of claim 1, wherein said block copolymer, when applied and annealed on a planar surface, self-assembles into an ordered array of multiple structural units comprising said polymeric block component B embedded in a polymeric matrix comprising said first polymeric block component A, wherein each of said multiple structural units has said width or diameter w, wherein said multiple structural units are spaced apart from each other in said ordered array by a distance s, and wherein $0.6\ (w+s) < d < 1.5\ (w+s)$.

8. The method of claim 7, wherein w ranges from about 10 nm to about 50 nm and s ranges from about 10 nm to about 60 nm, and wherein d ranges from about 40 nm to about 160 nm.

9. The method of claim 1, wherein said block copolymer comprises said first and second polymeric block components A and B, respectively, at a weight ratio of from about 60:40 to about 40:60, and wherein the single unit polymer block comprises a lamella that stands perpendicular to the upper surface of said line structure.

10. The method of claim 1, wherein said block copolymer is a diblock copolymer selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-block-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

11. The method of claim 1, wherein the tip-to-tip spacing of said two lines is approximately w.

12. The method of claim 1, wherein said mask layer is a photoresist.

13. The method of claim 1, wherein said line structure is a gate line structure.

14. A method for reducing tip-to-tip spacing between lines comprising:

providing a substrate and a line structure in said substrate;
forming a first mask layer over said substrate;
forming a second mask layer over said first mask layer;

performing a lithographic process over said second mask layer to create a trench opening of a width d in said second mask layer, wherein said trench opening is above said line structure in said substrate and substantially perpendicular to said line structure;

applying a layer of a block copolymer over said second mask layer, wherein said block copolymer comprises at least first and second polymeric block components A and B respectively that are immiscible with each other;

annealing said block copolymer layer to form a single unit polymer block of a width or a diameter w inside said trench opening, wherein w<d, and wherein said single unit polymer block comprises said polymeric block component B and is embedded in a polymeric matrix that comprises said first polymeric block component A;

selectively removing said second polymeric block component B to form a single opening of a width or a diameter w in said polymeric matrix inside said trench opening;

performing a first etch transfer process using said single opening as a mask to form a third opening in said first mask layer; and performing a second etch transfer process using said third opening in said first mask layer as a mask to form a fourth opening in said line structure in said substrate, wherein said fourth opening cuts said line structure into two lines.

15. The method of claim 14, further comprising forming an underlayer over said substrate, before forming said first mask layer.

16. The method of claim 15, further comprising stripping any remaining block copolymer layer, first mask layer, second mask layer and underlayer, after said second etch transfer process.

17. The method of claim 14, wherein said annealing is performed at a temperature from about 130° C. to about 230° C.

18. The method of claim 17, wherein said annealing is performed from about 40 minutes to about 80 minutes.

19. The method of claim 14, wherein said block copolymer layer has a thickness from about 15 nm to about 45 nm.

20. The method of claim 14, wherein said block copolymer, when applied and annealed on a planar surface, self-assembles into an ordered array of multiple structural units comprising said polymeric block component B embedded in a polymeric matrix comprising said first polymeric block component A, wherein each of said multiple structural units has said width or diameter w, wherein said multiple structural units are spaced apart from each other in said ordered array by a distance s, and wherein $0.6\ (w+s) < d < 1.5(w+s)$.

21. The method of claim 20, wherein w ranges from about 10 nm to about 50 nm and s ranges from about 10 nm to about 60 nm, and wherein d ranges from about 40 nm to about 160 nm.

22. The method of claim 14, wherein said block copolymer comprises said first and second polymeric block components A and B, respectively, at a weight ratio of from about 60:40 to about 40:60, and wherein the single unit polymer block comprises a lamella that stands perpendicular to the upper surface of said line structure.

23. The method of claim 14, wherein said block copolymer is a diblock copolymer selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-block-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

24. The method of claim 14, wherein the tip-to-tip spacing of said two lines is approximately w.

25. The method of claim 14, wherein said second mask layer is a photoresist.

26. The method of claim 14, wherein said line structure is a gate line structure.

* * * * *